United States Patent
Shang et al.

(10) Patent No.: US 6,647,993 B2
(45) Date of Patent: Nov. 18, 2003

(54) SURFACE-TREATED SHOWER HEAD FOR USE IN A SUBSTRATE PROCESSING CHAMBER

(75) Inventors: Quanyuan Shang, Saratoga, CA (US); Sheng Sun, San Jose, CA (US); Kam S. Law, Union City, CA (US); Emanuel Beer, San Jose, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 113 days.

(21) Appl. No.: 09/740,596

(22) Filed: Dec. 19, 2000

(65) Prior Publication Data

US 2001/0006070 A1 Jul. 5, 2001

Related U.S. Application Data

(62) Division of application No. 09/115,111, filed on Jul. 13, 1998, now Pat. No. 6,182,603.

(51) Int. Cl.[7] .................................................. B08B 7/04
(52) U.S. Cl. ...................... 134/1.1; 134/22.18; 438/905
(58) Field of Search ........................... 134/1.1, 1, 22.1, 134/22.18, 34; 438/905; 118/723 ME, 723 IR, 723 ER

(56) References Cited

U.S. PATENT DOCUMENTS

| | | | | | |
|---|---|---|---|---|---|
| 4,813,326 A | * | 3/1989 | Hirano et al. | ............... | 84/624 |
| 5,397,432 A | * | 3/1995 | Konno et al. | ............... | 134/1 |
| 5,581,874 A | * | 12/1996 | Aoki et al. | ............... | 269/8 |
| 5,788,778 A | * | 8/1998 | Shang et al. | ............... | 134/1 |
| 5,900,103 A | * | 5/1999 | Tomoyasu et al. | ........ | 118/723 E |
| 6,143,084 A | * | 11/2000 | Li et al. | ............... | 118/715 |

* cited by examiner

Primary Examiner—Alexander Markoff
(74) Attorney, Agent, or Firm—Adler & Associates

(57) ABSTRACT

A substrate processing system includes a processing chamber and a plasma source located external to the chamber. A conduit connects the plasma source to an interior region of the chamber to provide a reactive species to the chamber interior for cleaning interior surfaces of the chamber. A shower head, disposed between the plasma source and an interior region of the chamber, can serve as an electrode and also can serve as a gas distribution mechanism. The shower head includes a surface treatment, such as a non-anodized aluminum outer layer, an electro-polished surface of bare aluminum, or a fluorine-based protective outer layer. The surface-treated shower head improves the rate of removal of materials deposited on the interior surfaces of the chamber during cleaning, reduces contamination of substrates during processing, and provides more efficient use of the power source used for heating the substrate during processing.

3 Claims, 4 Drawing Sheets

SURFACE-TREATED SHOWER HEAD FOR USE IN A SUBSTRATE PROCESSING CHAMBER

CROSS REFERENCE TO RELATED APPLICATIONS

This is a divisional application of U.S. Ser. No. 09/115,111 filed on Jul. 13, 1998 U.S. Pat. No. 6,182,603.

The present invention is related to U.S. patent application Ser. No. 08/707,491, filed on Sep. 16, 1996 and entitled "A Deposition Chamber Cleaning Technique Using A High Power Remote Excitation Source." That application, which is assigned to the assignee of the present invention, is incorporated herein by reference in its entirety.

BACKGROUND

The present invention relates generally to substrate processing chambers, and, in particular, to a gas inlet manifold or shower head for such chambers.

Glass substrates are being used for applications such as active matrix television and computer displays, among others. Each glass substrate can form multiple display monitors each of which contains more than a million thin film transistors.

The glass substrates can have dimensions, for example, of 550 mm by 650 mm. The trend, however, is toward even larger substrate sizes, such as 650 mm by 830 mm and larger, to allow more displays to be formed on the substrate or to allow larger displays to be produced. The larger sizes place even greater demands on the capabilities of the processing systems.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

Plasma-enhanced chemical vapor deposition (PECVD) is another process widely used in the processing of glass substrates for depositing layers of electronic materials on the substrates. In a PECVD process, a substrate is placed in a vacuum deposition chamber equipped with a pair of parallel plate electrodes. The substrate generally is mounted on a susceptor which also serves as the lower electrode. A flow of a reactant gas is provided in the deposition chamber through a gas inlet manifold or shower head which also serves as the upper electrode. A radio frequency (RF) voltage is applied between the two electrodes which generates an RF power sufficient to cause a plasma to be formed in the reactant gas. The plasma causes the reactant gas to decompose and deposit a layer of the desired material on the surface of the substrate body. Additional layers of other electronic materials can be deposited on the first layer by flowing another reactant gas into the chamber. Each reactant gas is subjected to a plasma which results in the deposition of a layer of the desired material.

Though such systems are designed to deposit the material preferentially onto the surface of the substrate, some material is also deposited onto other interior surfaces within the chamber. After repeated use, the systems must be cleaned to remove the deposited layer of material that has built up in the chamber. To clean the chamber and the exposed components within the chamber, an in-situ dry cleaning process is sometimes used. According to one in-situ technique, precursor gases are supplied to the chamber. Then, by locally applying a glow discharge plasma to the precursor gases within the chamber, reactive species are generated. The reactive species clean the chamber surfaces by forming volatile compounds with the material deposited on those surfaces.

The foregoing in-situ cleaning technique has several disadvantages. First, it is inefficient to use a plasma within the chamber to generate the reactive species. Thus, it is necessary to use relatively high powers to achieve an acceptable cleaning rate. The high power levels, however, tend to produce damage to the hardware inside of the chamber thereby significantly shortening its useful life. Since the replacement of the damaged hardware can be quite costly, this can significantly increase the per substrate cost of a product that is processed using the deposition system. In the current, highly competitive semiconductor fabrication industry where costs per substrate are critical to the cost conscious purchasers, the increased operating costs resulting from periodically having to replace parts that are damaged during the cleaning process is very undesirable.

Another problem with the conventional in-situ dry cleaning processes is that the high power levels required to achieve acceptable cleaning rates also tend to generate residues or byproducts that can damage other system components, or which cannot be removed except by physically wiping off the internal surfaces of the chamber. As an example, in a deposition system in which the chamber or the process kit components (e.g. heater, shower head, clamping rings, etc.) are made of aluminum, a nitrogen fluoride ($NF_3$) plasma is often used to clean the interior surfaces. During the cleaning process, a certain amount of aluminum fluoride ($Al_xF_y$) is formed. The amount that is formed is increased significantly by the ion bombardment that results from the high plasma energy levels. Thus, a considerable amount of $Al_xF_y$ can be formed in the system and must be removed by physically wiping the surfaces.

A different technique for cleaning a process chamber is described in the previously mentioned U.S. patent application Ser. No. 08/707,491. The technique described in that application includes delivering a precursor gas into a remote chamber that is outside of the deposition chamber and activating the precursor gas in the remote chamber to form a reactive species. Activation of the precursor gas, which can include, for example, $NF_3$, is performed by using a remote activation source. The reactive species flows from the remote chamber into the deposition chamber and is used to clean the inside of the deposition chamber. Using a remote plasma source can reduce or eliminate the damage that occurs during the cleaning process.

As already mentioned, the shower head in some of the foregoing systems is formed from aluminum. Conventionally, the surface of the aluminum shower head in in-situ chambers is anodized to maintain its reliability. For example, the shower head can be anodized by dipping it into sulfuric acid, thereby forming a layer of aluminum oxide ($Al_2O_3$) over the surface of the shower head. One disadvantage of using an anodized aluminum shower head in a system having a remote plasma source is that the anodized aluminum appears to deactivate a significant amount of the fluorine radicals that form when the precursor gas $NF_3$ is activated. The result is that the rate at which the chamber can be cleaned is reduced.

SUMMARY

In general, in one aspect, a substrate processing system includes a processing chamber and a plasma source located external to the chamber. A conduit connects the plasma source to an interior region of the chamber to provide a reactive species to the chamber interior for cleaning interior surfaces of the chamber. A shower head having a non-anodized aluminum or bare aluminum outer layer presented to the interior region of the chamber is disposed between the plasma source and the chamber interior.

In the context of the present invention, the phrase "bare aluminum" is defined to refer to an aluminum material whose surface has been processed mechanically, chemically or using some other technique to remove various contaminants which may have accumulated on the surface during or subsequent to machining of the shower head. Although a thin native oxide subsequently may form over the surface of the aluminum, such aluminum is still referred to as "bare aluminum" for the purposes of the present invention.

According to another embodiment, the shower head can include a fluorine-based protective outer layer, such as aluminum fluoride or TEFLON®. The fluorine-based outer layer can be disposed, for example, on an aluminum material, such as an electro-polished aluminum surface.

In various implementations, one or more of the following features are present. The deposition chamber can be a CVD chamber, such as a plasma enhanced chemical deposition chamber, and can include multiple radio frequency (RF) powered electrodes. The shower head can serve as one of the electrodes as well as serving as a gas distribution mechanism to provide substantially uniform gas flow to an region of the chamber. The plasma source can include a precursor gas source comprising, for example, a fluorine-based compound, such as nitrogen fluoride.

In another aspect, a method of cleaning a processing chamber includes forming a reactive species external to the chamber and providing the reactive species to an interior region of the chamber via a shower head having a non-anodized or bare aluminum surface or an outer surface comprising an inert fluorine-based compound.

Various implementations include one or more of the following features. Forming the reactive species can include activating a precursor gas. The precursor gas can comprise, for example, a fluorine-based compound such as nitrogen fluoride. The reactive species can include, for example, fluorine radicals. Other precursor gases and reactive species also can be used.

Using the surface-treated shower head of the invention can increase the removal rate of materials deposited on inner surfaces of a substrate processing chamber. In other words, the chamber cleaning process can be made more efficient and, therefore, can be completed more quickly compared to the capabilities of a chamber with an anodized shower head. In addition, since the modified shower head tends to absorb fewer fluorine radicals during the cleaning process, there is less likelihood that a substrate will become contaminated during processing. Furthermore, the modified shower head can result in a higher reflectivity compared to an anodized shower head. The higher reflectivity results in a more efficient use of the heat source that heats the substrate in the chamber during processing.

Other features and advantages will be readily apparent from the following description, accompanying drawings and the claims.

DETAILED DESCRIPTION

Figure 1:
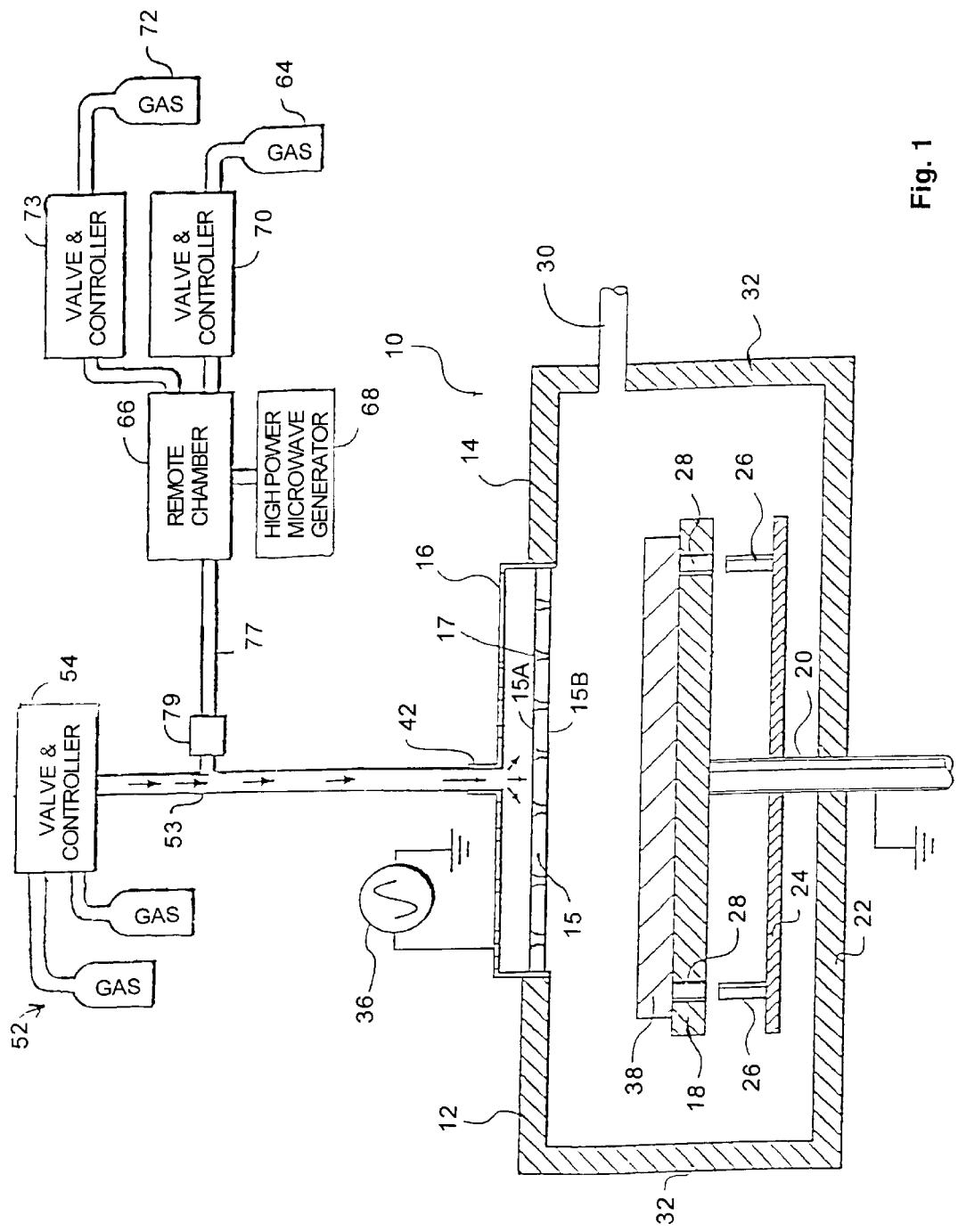
FIG. 1 illustrates a PECVD system according to the invention.

Referring to FIG. 1, a plasma-enhanced chemical vapor deposition (PECVD) apparatus 10 is part of a system having multiple process chambers which can be used, for example, to deposit amorphous silicon, silicon nitride, silicon oxide and oxy-nitride films on glass or other substrates. The PECVD system 10 can be used, for example, in the production of active-matrix liquid crystal displays.

The PECVD apparatus 10 includes a deposition chamber 12 having an opening through a top wall 14 and a shower head 16 within the opening. In general, the shower head 16 allows the gas to pass to the interior region of the chamber 12. In the illustrated implementation, the shower head 16 serves as a first electrode. In an alternative embodiment, the top wall 14 can be solid with the electrode 16 adjacent to the inner surface of the top wall. The shower head 16 also serves as a gas distribution mechanism which provides a substantially uniform gas flow to the interior of the chamber. A susceptor 18 in the form of a plate extends within the chamber 12 parallel to the first electrode 16.

Figure 2A:
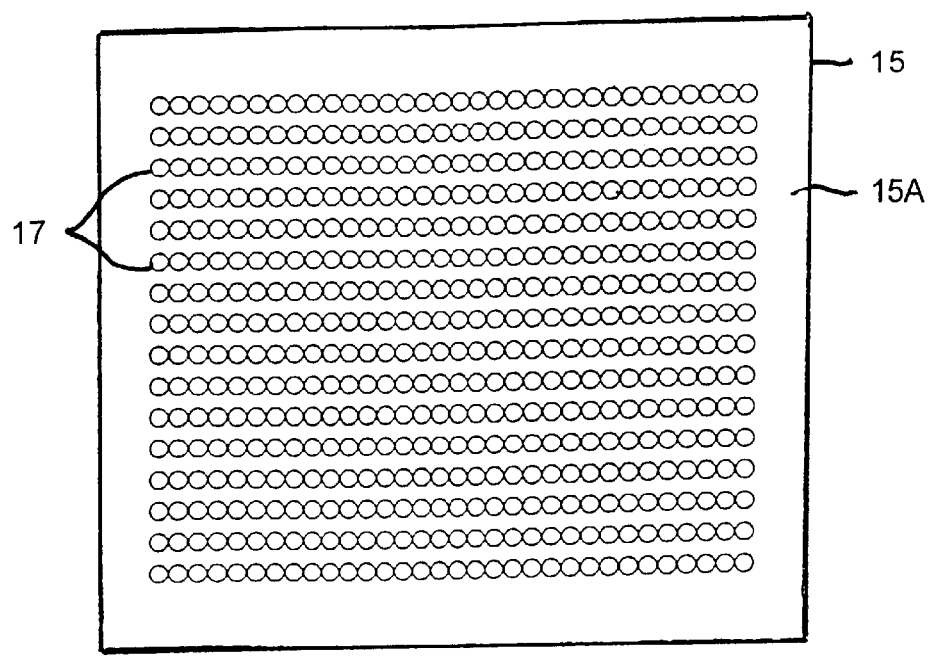
FIG. 2A illustrates a top view of an exemplary shower head.
Figure 2B:
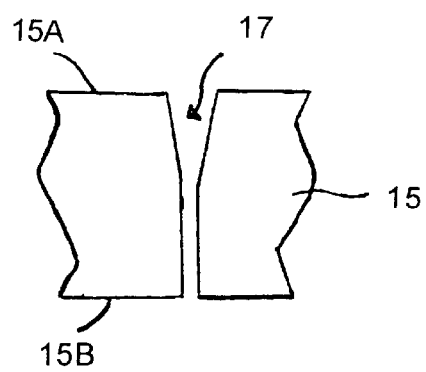
FIG. 2B shows a partial cross-section of the shower head of FIG. 2A.

The first electrode 16 (i.e., the gas inlet manifold) is connected to an RF power source 36 which is external to the chamber 12. In one implementation, the gas inlet manifold 16 includes a substantially rectangular-shaped shower head 15 (FIG. 2A), including, for example aluminum or an aluminum alloy, with multiple cone-shaped holes 17 extending from the top-surface 15A of the shower head to its bottom surface 15B (FIGS. 2A–2B). The holes 17 can be equally-spaced from one another such that a shower head having dimensions of approximately 600 mm by 700 mm may include several thousand holes.

The susceptor 18 may be formed of aluminum and can be coated with a layer of aluminum oxide. Embedded within the susceptor 18 are one or more heating elements which are controlled to heat the susceptor. The susceptor 18 is connected to ground so that it serves as a second electrode and is mounted on the end of a shaft 20 which extends vertically through a bottom wall 22 of the chamber 12. The shaft 20 is movable vertically to permit the vertical movement of the susceptor 18 toward and away from the first electrode 16.

A lift-off plate 24 extends horizontally between the susceptor 18 and the bottom wall 22 of the chamber 12 substantially parallel to the susceptor and is movable vertically. Lift-off pins 26 project vertically upward from the lift-off plate 24. The lift-off pins 26 are positioned to be able to extend through lift holes 28 in the susceptor 18, and have a length slightly longer than the thickness of the susceptor. While only two lift-off pins 26 are shown in FIG. 1, there may be additional lift-off pins spaced around the lift-off plate 24.

A gas outlet 30 extends through a side wall 32 of the chamber 12 and is connected to a pump (not shown), for evacuating the chamber.

A gas inlet conduit or pipe 42 extends into the gas inlet manifold 16 and is connected through a gas switching network 53 to sources of various gases. A gas supply 52 located outside the chamber 12 contains the gases that are used during deposition. The particular gases that are used depend upon the materials that are to be deposited onto the substrate. The process gases flow through the inlet pipe 42 into the gas manifold 16 and then into the chamber. An electronically operated valve and flow control mechanism 54 controls the flow of gases from the gas supply into the chamber 12.

A second gas supply system also is connected to the chamber through the inlet pipe 42. The second gas supply system supplies gas that is used to clean the inside of the chamber after a sequence of deposition runs. As used herein, the phrase "cleaning" refers to removing deposited material from the interior surfaces of the chamber. In some situations, the first and second gas supplies can be combined.

The second gas supply system includes a source of a precursor gas 64, a remote activation chamber 66 which is located outside and at a distance from the deposition chamber, a power source 68 for activating the precursor gas within the remote activation chamber, an electronically operated valve and flow control mechanism 70, and a conduit or pipe 77 connecting the remote chamber to the deposition chamber 12. Such a configuration allows interior surfaces of the chamber to be cleaned using a remote plasma source.

A flow restrictor 79 is provided in the pipe 77. The flow restrictor 79 can be placed anywhere in the path between the remote chamber 66 and the deposition chamber 12. Such a flow restrictor allows a pressure differential to be present between the remote chamber 66 and the deposition chamber 10.

The valve and flow control mechanism 70 delivers gas from the precursor gas source 64 into the remote activation chamber 66 at a user-selected flow rate. The power source 68 activates the precursor gas to form a reactive species which is then flowed through the conduit 77 into the deposition chamber via the inlet pipe 42. The upper electrode or gas inlet manifold 16 is, therefore, used to deliver the reactive gas into the interior region of the deposition chamber. In the described implementation, the remote chamber is a sapphire tube, and the power source is 2.54 gigaHertz (GHz) high power microwave generator with its output aimed at the sapphire tube.

Optionally, there also can be a source of a minor carrier gas 72 that is connected to the remote activation chamber through another valve and flow control mechanism 73. The minor carrier gas aids in the transport of the activated species to the deposition chamber and can be any nonreactive gas that is compatible with the particular cleaning process with which it is being used. For example, the minor carrier gas may be argon, nitrogen, helium, hydrogen, or oxygen, etc. In addition to aiding in the transport of activated species to the deposition chamber, the carrier gas also may assist in the cleaning process or help initiate and/or stabilize the plasma in the deposition chamber.

In the described implementation, the precursor gas is $NF_3$ which is suitable for cleaning chambers that have been deposited with silicon (Si), doped silicon, silicon nitride ($Si_3N_4$) or silicon oxide ($SiO_2$). In other implementations, the precursor gas can include other fluorine-based gases, such as carbon tetra-fluoride ($CF_4$), sulfur hexa-fluoride ($SF_6$) and perfluoro ethane ($C_2F_6$). The particular gas that is used depends on the deposited material which is being removed.

Figure 3:
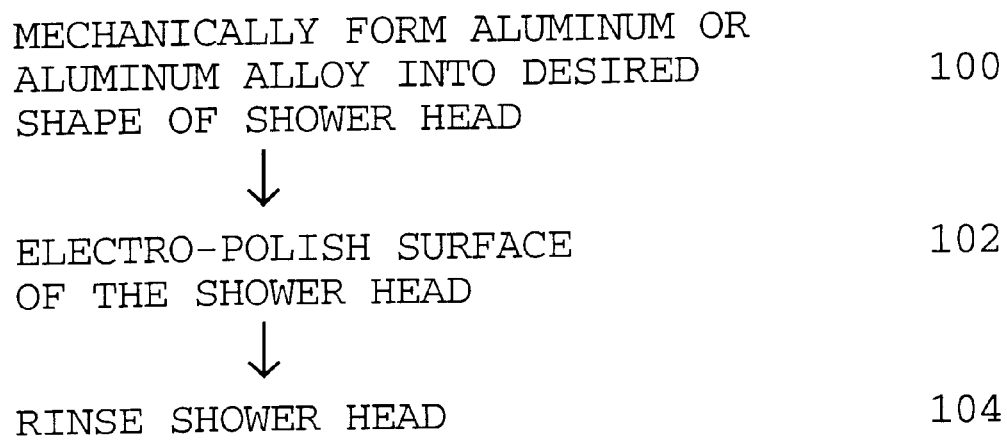
FIG. 3 is a flow chart of one method of forming a shower head according to the invention.
Figure 5A:
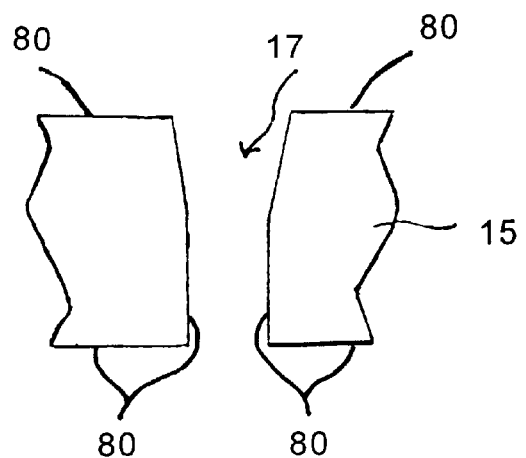
FIG. 5A shows a partial cross-section of a shower head with a bare aluminum surface according to the invention.

To enhance the performance of the cleaning technique, the shower head 15 is formed substantially of aluminum with a non-anodized aluminum surface. FIG. 3 illustrates one technique for forming such a shower head. First, as indicated by step 100, a block of aluminum or an aluminum alloy is mechanically formed into the desired shape of the shower head 15, including the holes 17. Next, one or more chemical, mechanical or other processes are performed to remove contaminants such as surface dirt, processing oils, traces of foreign metals, or residue films which may have accumulated on the surface of the aluminum during or subsequent to machining. For example, a standard electro-polishing process can be performed to remove such contaminants (step 102). In one implementation, the machined device is placed into a nitric acid bath for about one minute. The shower head then can be rinsed in water (step 104). The result is a shower head with a bare aluminum surface 80 (FIG. 5A).

Experimental results have indicated that in at least one PECVD configuration using a remote plasma source and a shower head made of type 6061 aluminum alloy without an anodization layer, the removal or etch rate of SiN from the chamber walls increased by about 28% relative to an anodized showed head. Furthermore, an electro-polished shower head increased the removal rate of SiN from the chamber walls by about 50% relative to the anodized shower head.

Figure 5B:
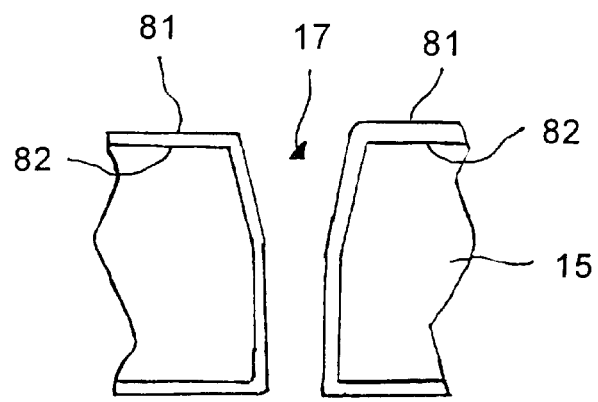
FIG. 5B shows a partial cross-section of a shower head with a outer coating of a fluorine-based compound according to the invention.

Alternatively, to improve the performance of the shower head 15 even further, a thin coating 81 of aluminum fluoride ($AlF_3$) or other fluorine-based compound can be provided on the outer surface of the shower head 15 (FIG. 5B). In general, the fluorine-based compound should be capable of forming an inert layer over the surface of the shower head 15. For example, a TEFLON® protective layer can be provided over the surface of the shower head 15.

Figure 4:
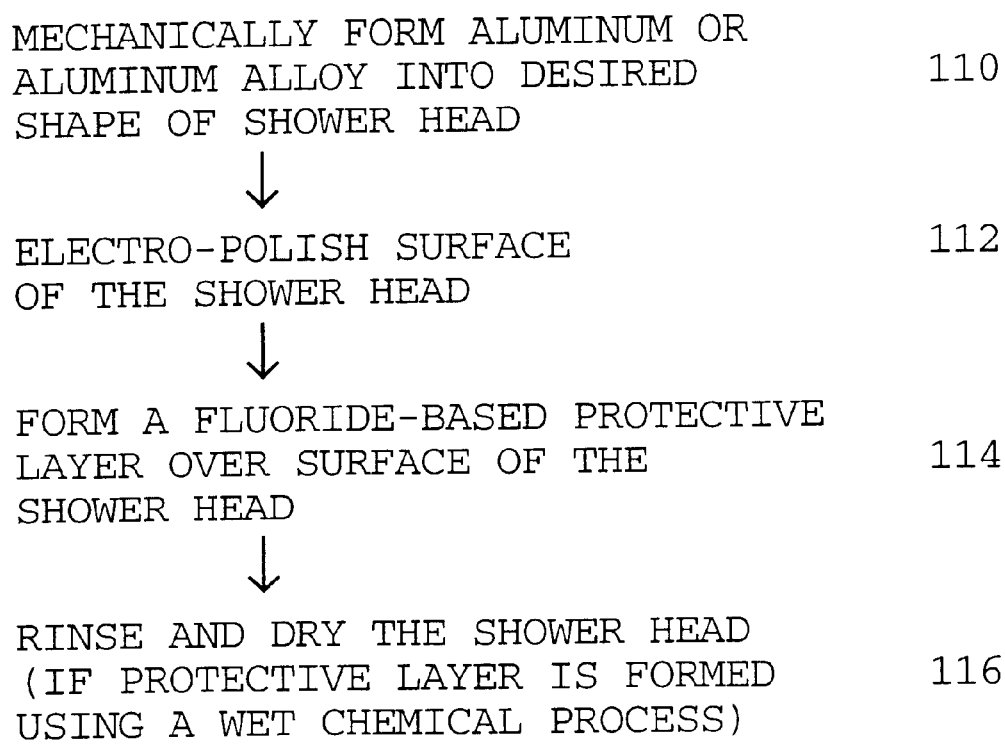
FIG. 4 is a flow chart of another method of forming a shower head according to the invention.

According to one technique (see FIG. 4), a block of aluminum or aluminum alloy is mechanically formed into the desired shape (step 110), and an electro-polishing process is performed, for example, by placing the machined shower head into a phosphoric acid bath to remove layers of films that may have accumulated during machining (step 112). Next, an aluminum-fluoride protective layer is formed over the surface of the shower head (step 114). In one implementation, the electro-polished shower head is placed into a hydrofluoric (HF) acid tank. For example, the shower head can be placed into a 2–5% solution of HF acid for approximately 1–5 minutes. The acid should circulate or be agitated while the shower head is in the HF acid tank. The shower head then is removed from the HF acid tank, rinsed in deionized water, and blown dry (step 116). The shower head also can be baked at about 100° C. for approximately an hour to dry it more thoroughly.

In an alternative embodiment, the aluminum-fluoride protective layer can be formed using a fluorine gas phase treatment. For example, after chemically polishing the shower head, it can be placed in a chamber for approximately one hour. Fluorine gas is provided to the interior of the chamber at a pressure of about 1–10 Torr and a temperature of about 350° C.

Although it is desirable to form the fluorine-based protective layer on a surface of bare aluminum such as an electro-polished aluminum surface 82 (FIG. 5B), it is not necessary to do so. For example, the fluorine-based layer can be formed on an aluminum surface from which the various contaminants discussed above have not been removed or which have only partially been removed. Moreover, the fluorine-based layer can be formed on an anodized aluminum surface as well.

In many situations, it is desirable to treat the entire exposed surface of the shower head according to one of the techniques discussed above. However, many of the advantages of the invention can be obtained by treating only the surface areas of the shower head which face or are presented to the interior of the chamber 10.

Using a non-anodized or bare aluminum shower head, an electro-polished shower head, or a shower head with a fluoride-based protective coating can provide other advantages in addition to increasing the removal rate of materials deposited on inner surfaces of the chamber 12. For example, the reflectivity of a non-anodized aluminum or electro-polished shower head 15 is generally higher compared to an anodized aluminum shower head. The higher reflectivity results in a more efficient use of the heat source that heats the substrate in the chamber during processing. Furthermore, use of the non-anodized shower head, the electro-polished shower head, as well a shower head with the fluoride-based protective layer, can reduce the amount of contamination which may occur during the deposition of thin films onto the substrate. The reduced contamination results from fewer fluorine radicals being absorbed by the shower head during the cleaning process.

Although the theory behind the improved performance of the shower head is not completely understood, it is believed that the modified shower head is less porous compared to an anodized shower head. The previously used anodized shower head may act as a catalyst to deactivate fluorine radicals and may allow the process gas to accumulate in the shower head, thereby reducing the efficiency of the cleaning gases. The non-anodized or electro-polished shower head, as well as the addition of the protective layer, may help reduce the amount of accumulation of fluorine radicals in the shower head and prevent the shower head from acting as a catalyst to deactivate the fluorine radicals. In any event, the theory behind the improved performance of the shower head is not critical to the invention.

Furthermore, although the implementation described above involves a PECVD system, the invention can be used with other systems, including PVD, CVD and etch systems, as well as other systems using a remote plasma source with a fluorine-based species.

Other implementations are within the scope of the following claims.

What is claimed is:

1. A method of cleaning a substrate processing chamber using a surface-treated showerhead, the method comprising:

disposing a non-anodized aluminum showerhead in an interior region of the substrate processing chamber, said showerhead having an exterior surface presented to the interior region, said exterior surface treated by electropolishing;

activating a fluorine-based precursor gas externally to the substrate processing chamber to form reactive fluorine radicals; and providing the reactive fluorine radicals to the interior region of the substrate processing chamber via said electropolished showerhead thereby cleaning the substrate processing chamber.

2. A method of cleaning a substrate processing chamber using a surface-treated showerhead, the method comprising:

disposing a non-anodized aluminum showerhead in an interior region of the substrate processing chamber, said showerhead having an exterior surface presented to the interior region, said exterior surface coated with an outer layer of polytetrafluoroethylene (PTFE);

activating a fluorine-based precursor gas externally to the substrate processing chamber to form reactive fluorine radicals; and providing the reactive fluorine radicals to the interior region of the substrate processing chamber via said polytetrafluoroethylene-coated shower head thereby cleaning the substrate processing chamber.

3. The method of claim 1 or claim 2 wherein the precursor gas includes nitrogen fluoride.

* * * * *